US012724082B2

(12) United States Patent
Oh et al.

(10) Patent No.: US 12,724,082 B2
(45) Date of Patent: Sep. 1, 2026

(54) BATTERY RESIDUAL VALUE EVALUATION SYSTEM AND OPERATION METHOD THEREOF

(71) Applicant: ELECTRONICS AND TELECOMMUNICATIONS RESEARCH INSTITUTE, Daejeon (KR)

(72) Inventors: Jimin Oh, Daejeon (KR); Kwang Man Kim, Daejeon (KR); Young-Gi Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 413 days.

(21) Appl. No.: 18/464,788

(22) Filed: Sep. 11, 2023

(65) Prior Publication Data

US 2024/0110995 A1 Apr. 4, 2024

(30) Foreign Application Priority Data

Sep. 23, 2022 (KR) ........................ 10-2022-0120887
Dec. 19, 2022 (KR) ........................ 10-2022-0178500

(51) Int. Cl.
*G01R 31/392* (2019.01)
*G01R 31/36* (2020.01)
(Continued)

(52) U.S. Cl.
CPC ....... *G01R 31/392* (2019.01); *G01R 31/3648* (2013.01); *G01R 31/367* (2019.01); *G01R 31/3842* (2019.01); *G01R 31/389* (2019.01)

(58) Field of Classification Search
None
See application file for complete search history.

(56) References Cited

U.S. PATENT DOCUMENTS 5,739,670 A * 4/1998 Brost .................. G01R 31/367 320/135
7,072,871 B1 * 7/2006 Tinnemeyer ......... G01R 31/367 706/900

(Continued)

FOREIGN PATENT DOCUMENTS

KR 10-2014-0052558 A 5/2014
KR 10-2016-0107709 A 9/2016

(Continued)

*Primary Examiner* — Shelby A Turner
*Assistant Examiner* — Cynthia L Davis

(57) ABSTRACT

Disclosed is a battery residual value evaluation system, which includes a measurement unit that measures a voltage and a current of an external battery to generate a voltage signal and a current signal, a resistance calculation unit that generates a resistance value, a resistance change value, and a resistance change rate of the external battery for each of charging and discharging cycles of the external battery based on the voltage signal and the current signal, an external input unit that receives reference ranges from an outside, a determination unit that determines a battery residual value based on whether the resistance value, the resistance change value, and the resistance change rate fall within the reference ranges, respectively, and an output unit that outputs the determination result to the outside.

14 Claims, 6 Drawing Sheets

(51) Int. Cl.

| | |
|---|---|
| ***G01R 31/367*** | (2019.01) |
| ***G01R 31/3842*** | (2019.01) |
| ***G01R 31/389*** | (2019.01) |

(56) References Cited

U.S. PATENT DOCUMENTS

| | | | | |
|---|---|---|---|---|
| 11,163,009 | B2 | 11/2021 | Lee | |
| 11,391,783 | B2 | 7/2022 | Myung et al. | |
| 2012/0107695 | A1 | 5/2012 | Lee et al. | |
| 2015/0207357 | A1 | 7/2015 | Youm et al. | |
| 2016/0375790 | A1* | 12/2016 | Komiyama | B60L 58/12 320/136 |
| 2018/0143818 | A1* | 5/2018 | Hirshberg | G06F 8/65 |
| 2025/0208227 | A1* | 6/2025 | Fujino | G01R 31/387 |

FOREIGN PATENT DOCUMENTS

| | | | |
|---|---|---|---|
| KR | 10-1944751 | B1 | 2/2019 |
| KR | 10-2019-0044399 | A | 4/2019 |
| KR | 10-2020-0017367 | A | 2/2020 |
| KR | 10-2307766 | B1 | 10/2021 |
| KR | 10-2367195 | B1 | 2/2022 |
| KR | 10-2022-0046136 | A | 4/2022 |
| KR | 10-2022-0058250 | A | 5/2022 |

* cited by examiner

BATTERY RESIDUAL VALUE EVALUATION SYSTEM AND OPERATION METHOD THEREOF

CROSS-REFERENCE TO RELATED APPLICATIONS

This application claims priority under 35 U.S.C. § 119 to Korean Patent Application Nos. 10-2022-0120887 filed on Sep. 23, 2022, and 10-2022-0178500 filed on Dec. 19, 2022, respectively, in the Korean Intellectual Property Office, the disclosures of which are incorporated by reference herein in their entireties.

BACKGROUND

Embodiments of the present disclosure described herein relate to a residual value evaluation system and an operation method thereof, and more particularly, relate to a battery residual value evaluation system and an operation method thereof.

Lithium secondary batteries are widely used as a power source for medium and large-sized devices such as electric vehicles (EVs) and energy storage systems (ESSs), and there is a demand for research on a reuse of lithium secondary batteries.

When the residual value such as the remaining life of the lithium secondary battery can be quickly evaluated, the lithium secondary battery that can no longer be used due to a decrease in capacity due to use may be reused or remanufactured.

However, lithium secondary batteries have many physical limitations in reusing them due to differences in materials, chemical components, and cell types. In addition, there is a difficulty in that a criterion for determining the residual value of the lithium secondary battery is not clear.

SUMMARY

Embodiments of the present disclosure provide a battery residual value evaluation system capable of quickly and accurately predicting the residual value of a lithium secondary battery by calculating a resistance change rate of the lithium secondary battery, and an operation method thereof.

According to an embodiment of the present disclosure, a battery residual value evaluation system includes a measurement unit that measures a voltage and a current of a battery to generate a voltage signal and a current signal, a resistance calculation unit that generates a resistance value, a resistance change value, and a resistance change rate of the battery for each of charging and discharging cycles of the battery based on the voltage signal and the current signal, an external input unit that receives reference ranges from an outside, a determination unit that determines a battery residual value based on whether the resistance value, the resistance change value, and the resistance change rate fall within the reference ranges, respectively, and an output unit that outputs the determination result to the outside.

According to an embodiment, the battery residual value evaluation system may further include a conversion unit that generate a digital signal by converting the voltage signal and the current signal, which are analog signals.

According to an embodiment, the battery residual value evaluation system may further include a measurement register unit that stores the digital signal, and the measurement register unit may include a voltage register that stores the digital signal generated by converting the voltage signal and a current register that stores the digital signal generated by converting the current signal.

According to an embodiment, the resistance calculation unit may calculate the resistance value, the resistance change value, and the resistance change rate when a current value of the digital signal stored in the current register changes.

According to an embodiment, the battery residual value evaluation system may further include a resistance register unit that stores the resistance value, the resistance change value, and the resistance change rate.

According to an embodiment, the reference ranges may include a first reference range, a second reference range, and a third reference range.

The first reference range may include information on a minimum resistance value and a maximum resistance value which are criteria for determining the battery residual value, the second reference range may include information on a minimum resistance change value and a maximum resistance change value which are criteria for determining the battery residual value, and the third reference range may include information on a minimum resistance change rate and a maximum change rate which are criteria for determining the battery residual value.

According to an embodiment, the each first to third reference ranges may be pre-learned and generated through machine learning.

According to an embodiment, when the resistance value is greater than the minimum resistance value included in the first reference range and is not less than the maximum resistance value included in the first reference range, the determination result may include information indicating that the battery value is low.

According to an embodiment, when the resistance value is greater than the minimum resistance value included in the first reference range and is less than the maximum resistance value included in the first reference range, and when the resistance change value is greater than the minimum resistance change value included in the second reference range and is not less than the maximum resistance change value included in the second reference range, the determination result may include information indicating that the battery value is low.

According to an embodiment, when the resistance value is greater than the minimum resistance value included in the first reference range and is less than the maximum resistance value included in the first reference range, when the resistance change value is greater than the minimum resistance change value included in the second reference range and is less than the maximum resistance change value included in the second reference range, and when the resistance change rate is greater than the minimum resistance change rate included in the third reference range and is not less than the maximum resistance change rate included in the third reference range, the determination result may include information indicating that the battery residual value is medium.

According to an embodiment, when the resistance value is greater than the minimum resistance value included in the first reference range and is less than the maximum resistance value included in the first reference range, when the resistance change value is greater than the minimum resistance change value included in the second reference range and is less than the maximum resistance change value included in the second reference range, and when the resistance change rate is greater than the minimum resistance change rate included in the third reference range and is less than the maximum resistance change rate included in the third reference range, the determination result may include information indicating that the battery residual value is high.

According to an embodiment of the present disclosure, a method of operating a battery residual value evaluation system including a battery that repeatedly performs charging and discharging operations during a plurality of cycles and a residual value evaluation device connected to the battery, includes generating a voltage signal and a current signal by measuring a voltage and a current of the battery, generating a resistance value, a resistance change value, and a resistance change rate of the battery for each of charging and discharging cycles of the battery based on the voltage signal and the current signal, determining whether the resistance value falls within a first reference range, determining whether the resistance change value falls within a second reference range, and determining whether the resistance change rate falls within a third reference range.

According to an embodiment, the first reference range may include information on a minimum resistance value and a maximum resistance value which are criteria for determining the battery residual value, the second reference range may include information on a minimum resistance change value and a maximum resistance change value which are criteria for determining the battery residual value, and the third reference range may include information on a minimum resistance change rate and a maximum change rate which are criteria for determining the battery residual value.

According to an embodiment, the generating of the resistance value, the resistance change value, and the resistance change rate may include the resistance value, the resistance change value, and the resistance change rate when a current value included the current signal changes.

According to an embodiment, the determining of whether the resistance value falls within the first reference range may further include, when the resistance value is greater than the minimum resistance value included in the first reference range and is not less than the maximum resistance value included in the first reference range, externally displaying a determination result including information which the battery residual value is low.

According to an embodiment, the determining of whether the resistance change value falls within the second reference range may further include, when the resistance change value is greater than the minimum resistance change value included in the second reference range and is not less than the maximum resistance value included in the second reference range, externally displaying a determination result including information which the battery residual value is low.

According to an embodiment, the determining of whether the resistance change rate falls within the third reference range may further include, when the resistance change rate is greater than the minimum resistance change rate included in the third reference range and is not less than the maximum resistance change rate included the third reference range, externally displaying a determination result including information which the battery residual value is medium, and when the resistance change rate is greater than the minimum resistance change rate included in the third reference range and is less than the maximum resistance change rate included the third reference range, externally displaying a determination result including information which the battery residual value is high.

BRIEF DESCRIPTION OF THE FIGURES

The above and other objects and features of the present disclosure will become apparent by describing in detail embodiments thereof with reference to the accompanying drawings.

DETAILED DESCRIPTION

Hereinafter, embodiments of the present disclosure will be described clearly and in detail such that those skilled in the art may easily carry out the present disclosure. In the description below, the terms "block", "unit", "module", etc. or components corresponding to the terms may be implemented in the form of software, hardware, or a combination thereof.

In the following drawings or in the detailed description, modules may be connected with any other components except for components illustrated in a drawing or described in the detailed description. Modules or components may be connected directly or indirectly. Modules or components may be connected through communication or may be physically connected.

Figure 1:
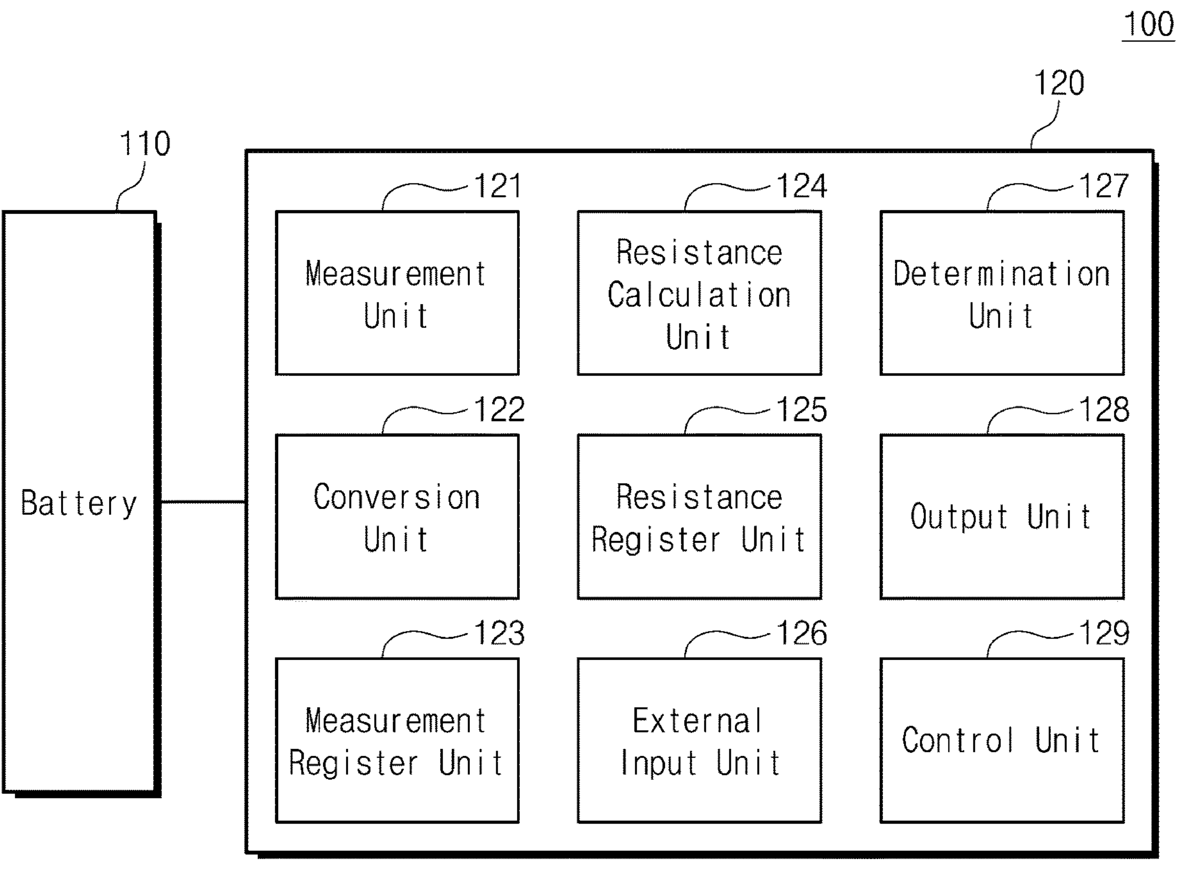
FIG. 1 is a block diagram illustrating a battery residual value evaluation system, according to an embodiment of the present disclosure.

FIG. 1 is a block diagram illustrating a battery residual value evaluation system, according to an embodiment of the present disclosure. Referring to FIG. 1, a battery residual value evaluation system 100 may include a battery 110 and a residual value evaluation device 120.

The battery 110 may include a lithium secondary battery that repeatedly performs charging and discharging operations. The battery 110 may be implemented in the form of a lithium secondary battery module configured by connecting a plurality of lithium secondary battery cells in series or parallel or a battery pack configured by connecting a plurality of lithium secondary battery modules in series or parallel.

For example, the battery 110 may repeatedly perform charging and discharging operations during a plurality of cycles. Accordingly, an interface layer between the electrode and the electrolyte of the battery 110 may be thick. Therefore, internal resistance of the battery 110 may increase. Accordingly, the capacity of the battery may decrease compared to the initial capacity, and the performance of the battery may deteriorate.

In an embodiment, the battery 110 may include a lithium secondary battery, a lithium secondary battery module, or a battery pack that is already deteriorated and degraded due to repeated charging and discharging operations for a plurality of cycles.

The residual value evaluation device 120 may include a measurement unit 121, a conversion unit 122, a measurement register unit 123, a resistance calculation unit 124, a resistance register unit 125, an external input unit 126, a determination unit 127, an output unit 128, and a control unit 129.

The residual value evaluation device 120 may be connected to the battery 110. For example, the residual value evaluation device 120 may be connected to a positive plate and a negative plate of the battery 110. The residual value evaluation device 120 may evaluate the residual value of the battery 110.

The measurement unit 121 may measure the voltage and current of the battery 110 and may generate a voltage signal and a current signal. In this case, the voltage signal and the current signal may be analog signals. For example, the measurement unit 121 may include a voltage measurer having a precision capable of measuring from several millivolts (mV) to several volts (V) for precise voltage measurement. For precise current measurement, the measurement unit 121 may include a current measurer having a precision capable of measuring from several milliamperes (mA) to hundreds of amperes (A). However, the present disclosure is not limited thereto, and the measurement unit 121 may vary according to the number of lithium secondary batteries included in the battery 110 to be measured, the module type, and the battery pack type.

The conversion unit 122 may receive the current signal and the voltage signal generated by the measurement unit 121. The conversion unit 122 may include one or more analog-to-digital converters. For example, an analog-to-digital converter may convert an analog signal having a frequency range of several millihertz (mhz) to several gigahertz (Ghz) into a digital signal of 10 to 16 bits. However, the present disclosure is not limited thereto. The conversion unit 122 may convert the current signal and the voltage signal into digital signals without distortion by using an analog-to-digital converter. The digital signal may include information about a voltage value and a current value for each charging and discharging cycle of the battery 110.

The measurement register unit 123 may store the digital signal generated by the conversion unit 122. For example, the measurement register unit 123 may include a voltage resistor and a current resistor. The measurement register unit 123 may store a digital signal including information about the voltage value of the battery 110 in the voltage register and may store a digital signal including information about the current value of the battery 110 in the current register. In detail, the measurement register unit 123 may store the voltage value and current value of the battery 110.

The resistance calculation unit 124 may calculate information (e.g., resistance information) related to the internal resistance of the battery 110. In an embodiment, the resistance information may include information such as a resistance value, a resistance change value, and a resistance change rate of the battery 110. For example, the resistance change value may indicate how much the internal resistance value of the battery 110 changes compared to the initial resistance value as the number of charging and discharging cycles increases. For example, the resistance change rate may mean a change rate of the internal resistance value of the battery 110 as the number of charging and discharging cycles increases.

For example, the resistance calculation unit 124 may receive a digital signal including information on a voltage value from a voltage register included in the measurement register unit 123, and may receive a digital signal including information on a current value from a current register included in the measurement register unit 123. For example, the resistance calculator 124 may calculate a resistance value, a resistance change value, and a resistance change rate based on voltage values and current values included in digital signals.

In an embodiment, the resistance calculation unit 124 may calculate resistance information of the battery 110 for each charging and discharging cycle of the battery 110. The resistance calculation unit 124 may calculate an internal resistance value based on digital signals including information about voltage and current values of the battery 110.

In an embodiment, the resistance calculation unit 124 may calculate resistance information by an algorithm that minimizes calculations. In detail, the resistance value, the resistance change value, and the resistance change rate may be calculated only when there is a change in the current value of the digital signal received from the current register.

The resistance register unit 125 may include registers that store the resistance value, the resistance change value, and the resistance change rate, which are calculated by the resistance calculation unit 124.

The external input unit 126 may receive a plurality of reference ranges for determining the residual value of the battery 110 from the outside. The reference ranges may include a reference range associated with a resistance value, a reference range associated with a resistance change value, and a reference range associated with a resistance change rate.

In detail, the reference range associated with the resistance value may include information on the minimum and maximum values of the resistance value for determining that the residual value of the battery 110 is high. The reference range associated with the resistance change value may include information on minimum and maximum values of the resistance change value for determining that the residual value of the battery 110 is high. The reference range associated with the resistance change rate may include information on minimum and maximum values of the resistance change rate for determining that the residual value of the battery 110 is high.

For example, the external input unit 126 may receive a plurality of reference ranges from the outside through Inter-Integrated Circuit (I2C) communication. For example, each of the plurality of reference ranges may be data generated through machine learning in advance.

The determination unit 127 may determine the residual value of the battery 110 based on the resistance value, the resistance change value, the resistance change rate, and the plurality of reference ranges. The determination unit 127 may generate a determination result of the residual value of the battery 110. For example, the determination unit 127 may determine the residual value of the battery 110 based on whether the resistance value stored in the resistance register unit 125 falls within the reference range associated with the resistance value, whether the resistance change value stored in the resistance register unit 125 falls within the reference associated with the resistance change value, and whether the resistance change rate stored in the resistance register unit 125 falls within the reference range associated with the resistance change rate.

For example, when the resistance value does not fall within the reference range associated with the resistance value, the determination unit 127 may generate a determination result including information indicating that the residual value of the battery 110 is low. The determination unit 127 may generate a determination result including information indicating that the residual value of the battery 110 is low when the resistance value falls within the reference range associated with the resistance value and the resistance change value does not fall within the reference range associated with the resistance change value. The determination unit 127 may generate a determination result including information indicating that the residual value of the battery 110 is medium when the resistance value falls within the reference range associated with the resistance value, the resistance change value falls within the reference range associated with the resistance change value, and the resistance change rate does not fall within the reference range associated with the resistance change rate. The determination unit 127 may generate a determination result including information indicating that the residual value of the battery 110 is high when the resistance value falls within the reference range associated with the resistance value, the resistance change value falls within the reference range associated with the resistance change value, and the resistance change rate falls within the reference range associated with the resistance change rate.

The output unit 128 may include one or more display devices (e.g., a display monitor) for displaying information to a user. The output unit 128 may externally display the determination result generated by the determination unit 127 through a display device. Accordingly, the user of the battery residual value evaluation system 100 may identify the residual value of the battery 110 at the outside.

The control unit 129 may generate control signals for controlling the above-described components. The controller 129 may output control signals to each of the components.

The battery residual value evaluation system 100 according to the present disclosure may determine the residual value of the battery 110 based on a resistance value, a resistance change value, and a resistance change rate. In detail, the battery residual value evaluation system 100 may provide a criterion for determining the residual value of the battery 110 with reduced performance by repeatedly performing charging and discharging operations for a plurality of cycles. In addition, the battery residual value evaluation system 100 may accurately and quickly estimate the residual value of the battery 110 in a non-destructive manner without disassembling the battery 110.

Figure 2:
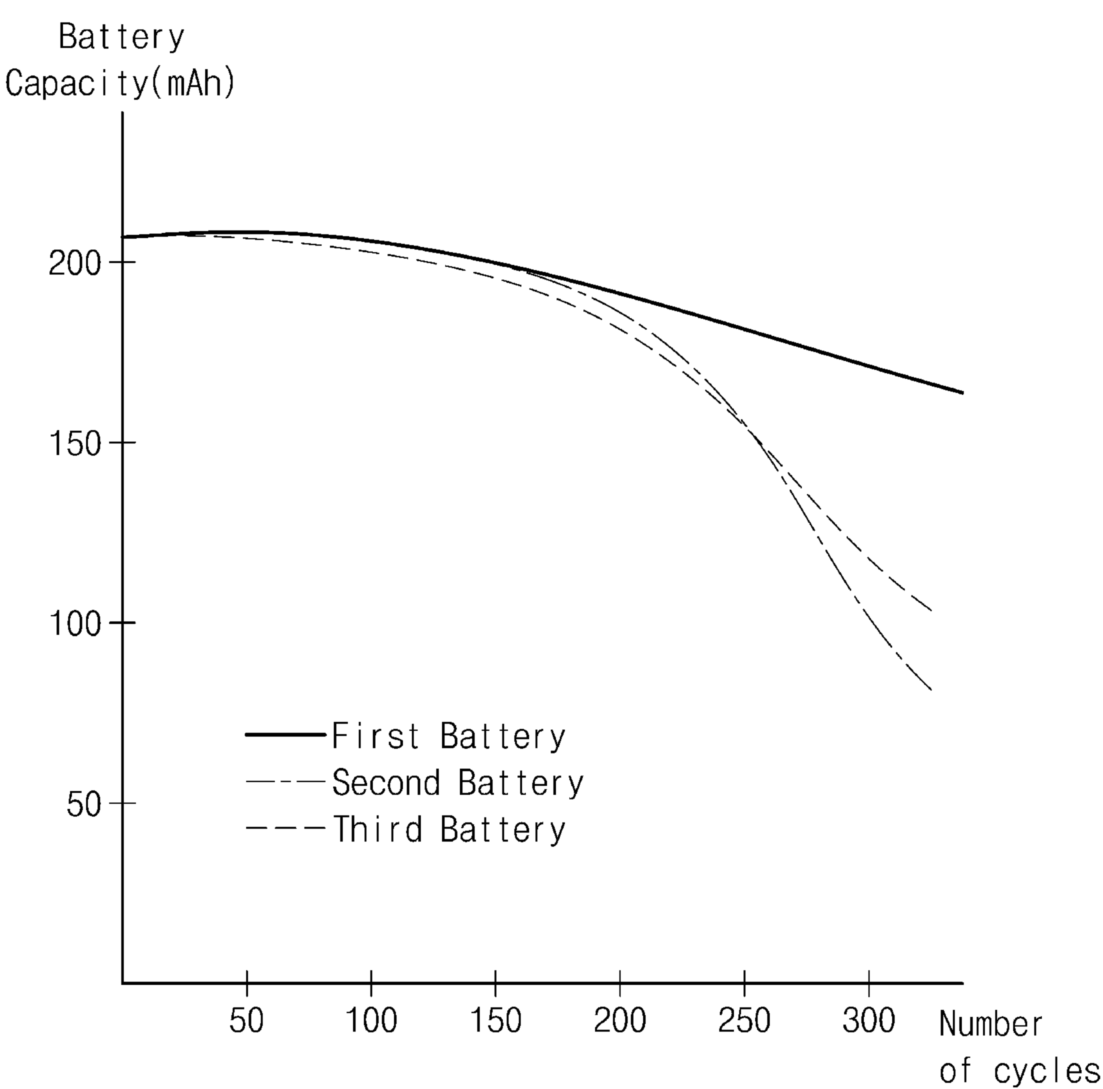
FIG. 2 is a graph illustrating a change in capacity according to the number of charging and discharging cycles of a battery of FIG. 1.

FIG. 2 is a graph illustrating a change in capacity according to the number of charging and discharging cycles of a battery of FIG. 1. In detail, the graph of FIG. 2 illustrates a change in capacity according to a change in the number of charging and discharging cycles of first to third batteries having different electrolyte components. In the graph of FIG. 2, a horizontal axis represents the number of charging and discharging cycles of the battery 110, and a vertical axis represents the capacity of the battery 110.

Each of the first to third batteries may be a lithium secondary battery including a positive plate, a negative plate, an electrolyte, and a separator.

In an embodiment, the positive plate of the first battery may be manufactured by preparing a mixture in which an NCM cathode active material, a carbon black conductive material, and a PVDF (polyvinylidene fluoride) binder are mixed with an N-methyl-2pyrrolidone (NMP) solvent in a 94:3:3 weight percent ratio, then depositing and drying the mixture to a positive current collector having a thickness of 10 micrometers (μm), and performing roll pressing on it. The negative plate of the first battery may be manufactured using a lithium (Li) metal foil having a thickness of 300 micrometer. The electrolyte of the first battery may be manufactured by dissolving a lithium salt ($LiPF_6$) having a concentration of 1M in a mixture in which ethylene carbonate and ethylmethyl carbonate are mixed in a volume ratio of 3:7, and adding thereto 5 weight percent of fluoroethyl carbonate (FEC) based on the weight of the electrolyte and mixing them. The first battery may be a lithium secondary battery manufactured by injecting the above-described electrolyte into a coin cell manufactured by sequentially stacking the above-described positive plate, a porous film separator made of polyethylene, and the above-described negative plate.

In an embodiment, a positive plate and a negative plate of the second battery may be manufactured in the same way as the first battery. The electrolyte of the second battery may be manufactured by dissolving a lithium salt ($LiPF_6$) having a concentration of 1M in a mixture in which ethylene carbonate and ethylmethyl carbonate are mixed in a volume ratio of 3:7, and adding thereto 5 weight percent of fluoroethyl carbonate (FEC) based on the weight of the electrolyte and mixing them. The second battery may be a lithium secondary battery manufactured by injecting the above-described electrolyte into a coin cell manufactured by sequentially stacking the above-described positive plate, a porous film separator made of polyethylene, and the above-described negative plate.

In an embodiment, the positive plate and the negative plate of the third battery may be manufactured in the same way as those of the first and second batteries. The electrolyte of the third battery may be manufactured by dissolving a lithium salt ($LiPF_6$) having a concentration of 1M in a mixture in which ethylene carbonate and ethylmethyl carbonate are mixed in a volume ratio of 3:7, and adding thereto 5 weight percent of fluoroethyl carbonate (FEC) and 10 weight percent of functional additives based on the weight of the electrolyte and mixing them. The third battery may be a lithium secondary battery manufactured by injecting the above-described electrolyte into a coin cell manufactured by sequentially stacking the above-described positive plate, a porous film separator made of polyethylene, and the above-described negative plate.

In FIG. 2, each of the first to third batteries repeatedly performs charging and discharging operations during a plurality of cycles. Each of the first to third batteries is fully charged and fully discharged for each cycle. Each of the first to third batteries is discharged for 10 seconds at a 5 C-rate in a state in which batteries are charged up to 50% of their initial capacity every 50 cycles. The battery capacity of each of the first to third batteries is measured every 50 cycles. For convenience of description and brevity of drawings, first to third batteries will be described below. However, the present disclosure is not limited thereto and the battery residual value evaluation system 100 according to the present disclosure may evaluate residual values of batteries 110 having various types.

Referring to FIG. 2, the first to third batteries have similar capacity changes up to 150 cycles. However, as 200 cycles pass, the second and third batteries have a characteristic of rapidly decreasing capacity. Accordingly, the first battery among the first to third batteries has the highest residual value.

Referring to FIG. 2, when the residual value of the battery 110 is determined based only on the battery capacity, charging and discharging operations of 300 or more cycles may be required to confirm the tendency of the change in the capacity of the battery 110. Accordingly, the battery residual value evaluation system 100 may not quickly determine the residual value of the battery 110. In addition, the battery residual value evaluation system 100 may not accurately determine the residual value of the battery 110 in response to a sudden change in capacity. Therefore, a criterion for quickly and accurately determining the residual value of the battery 110 may be required.

Figure 3:
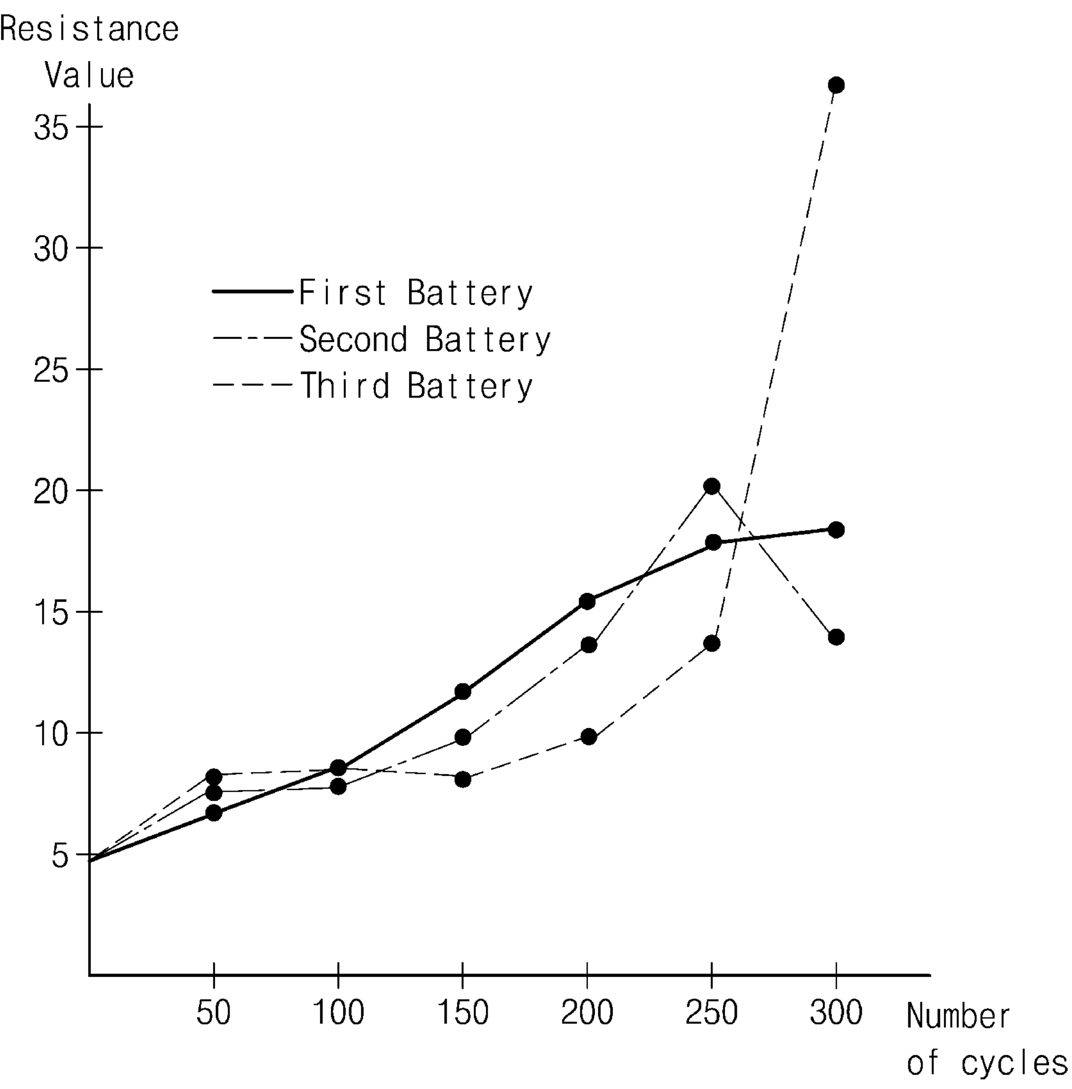
FIG. 3 is a graph illustrating resistance values according to the number of charging and discharging cycles of a battery of FIG. 1.

FIG. 3 is a graph illustrating a change in resistance value according to the number of charging and discharging cycles of the battery of FIG. 1. In detail, the graph of FIG. 3 illustrates changes in internal resistance values of the first to third batteries having different electrolyte components as the number of charging and discharging cycles changes. In the graph of FIG. 3, a horizontal axis represents the number of charging and discharging cycles of the battery 110, and a vertical axis represents a resistance value indicating the size of the internal resistance of the battery 110 according to the number of charging and discharging cycles. The resistance value may be calculated by the resistance calculation unit 124 of FIG. 1. The configuration of each of the first to third batteries is as described above with respect to FIG. 2.

For example, each of the first to third batteries may repeatedly perform charging and discharging operations during a plurality of cycles. Accordingly, an interface layer between the electrode and the electrolyte of the battery may be thick. Therefore, internal resistance of each of the first to third batteries may increase. In addition, resistance in the electrolyte may increase due to the lithium salt included in the electrolyte of each of the first to third batteries.

Referring to FIG. 3, for the above reasons, as the number of charging and discharging cycles of the battery 110 increases, the resistance values of each of the first to third batteries may increase.

The resistance value of the first battery increases almost linearly as the number of cycles increases. In the case of the second battery, the increase rate of the resistance value during 50 to 150 cycles is slower than the increase rate of the resistance value during 0 to 50 cycles. For example, it may be considered that the battery residual value evaluation system 100 evaluates the residual value of the battery based only on the resistance value. In this case, the battery residual value evaluation system 100 may determine residual values of the first to third batteries that are charged and discharged only up to 150 cycles. In this case, the battery residual value evaluation system 100 may erroneously estimate that the second battery has a higher residual value than the first battery.

In the case of the third battery, the increase rate of the resistance value decreases during 0 to 100 cycles, and the resistance value decreases during 100 to 150 cycles. For example, it may be considered that the battery residual value evaluation system 100 evaluates the residual value of the battery based only on the resistance value. In this case, the battery residual value evaluation system 100 may determine residual values of the first to third batteries that are charged and discharged only up to 150 cycles. In this case, the battery residual value evaluation system 100 may erroneously estimate that the third battery has a higher residual value than the first battery.

However, the resistance value change pattern of each of the first to third batteries is different from each other after 150 cycles. Therefore, the battery residual value evaluation system 100 may determine the residual value of the battery 110 more accurately only when the residual value of the battery 110 is evaluated after battery charging and discharging operations are performed for more than 300 cycles.

In other words, when the residual value of the battery is determined based only on the resistance value, it may be mistakenly determined that the second and third batteries have higher residual values than the first battery, and the residual value of the battery may not be quickly determined.

Meanwhile, in the case of the first battery having a high residual value, the resistance value increase rate during 150 to 250 cycles is almost the same as the resistance value increase rate during 0 to 150 cycles. In addition, there is little change in the resistance value after 250 cycles.

In other words, referring to FIGS. 2 and 3, considering the change pattern in the resistance value of the first battery, in the case of a battery with a high residual value, the internal resistance value increases linearly for a specific cycle and then saturates. Accordingly, the residual value of the battery 110 may be related to the battery resistance value.

In detail, in the case of a battery with a high residual value, as the number of charging and discharging cycles of the battery 110 increases, the resistance value of the battery may need to increase with a linearity of a specific level or higher. Accordingly, the residual value of the battery may be accurately evaluated through the change rate of the battery resistance value.

Figure 4:
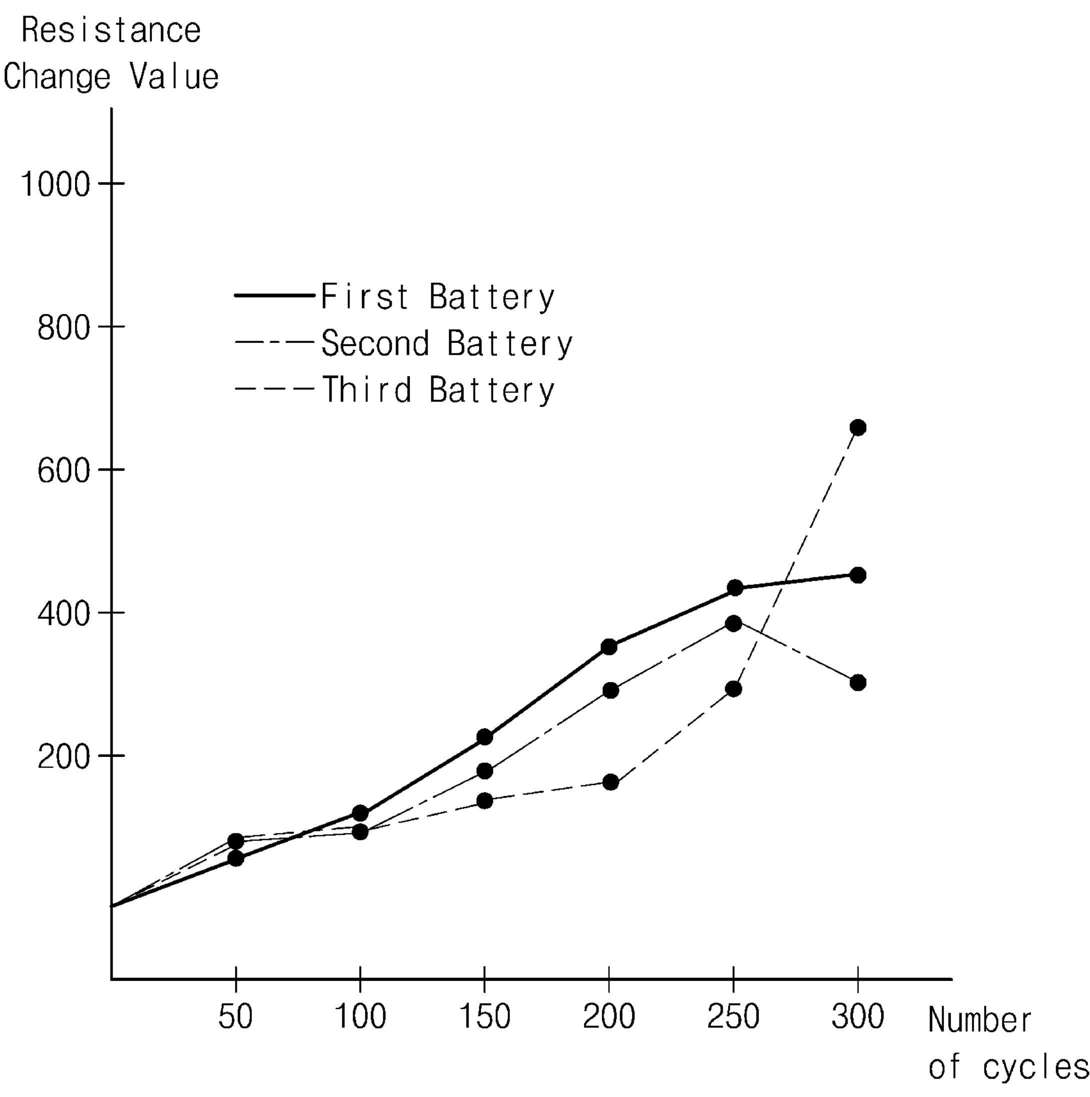
FIG. 4 is a graph illustrating resistance change values according to the number of charging and discharging cycles of a battery of FIG. 1.

FIG. 4 is a graph illustrating resistance change values according to the number of charging and discharging cycles of a battery of FIG. 1. In detail, the graph of FIG. 4 illustrates resistance change values according to the number of charging and discharging cycles of the first to third batteries having different electrolyte components. In the graph of FIG. 4, a horizontal axis represents the number of charging and discharging cycles of the battery 110, and a vertical axis represents change values in internal resistance of the battery 110 according to the number of charging and discharging cycles. The resistance change value may be calculated by the resistance calculation unit 124 of FIG. 1. The configuration of each of the first to third batteries is as described above with respect to FIG. 2.

The resistance change value may be calculated using Equation 1 below.

$$\text{Resistance change value} = \frac{R - R_0}{R_0} \times 100 \quad \text{[Equation 1]}$$

Here, 'R' means the resistance value in the current charging and discharging cycle. $R_0$ means the initial resistance value.

Referring to FIG. 4, the change tendency of the resistance change value according to the increase in the number of charging and discharging cycles of the first to third batteries is similar to the change tendency of the resistance value of FIG. 3. The resistance change value of the second battery may be measured to be lower than the resistance change value of the first battery. Accordingly, when the residual value of the battery is determined based only on the resistance value and the resistance change value, it may be erroneously determined that the residual value of the second battery is higher than that of the first battery.

In detail, when the residual value of the battery is determined based only on the resistance value and the resistance change value, the residual value of the battery may not be quickly and accurately determined.

Figure 5:
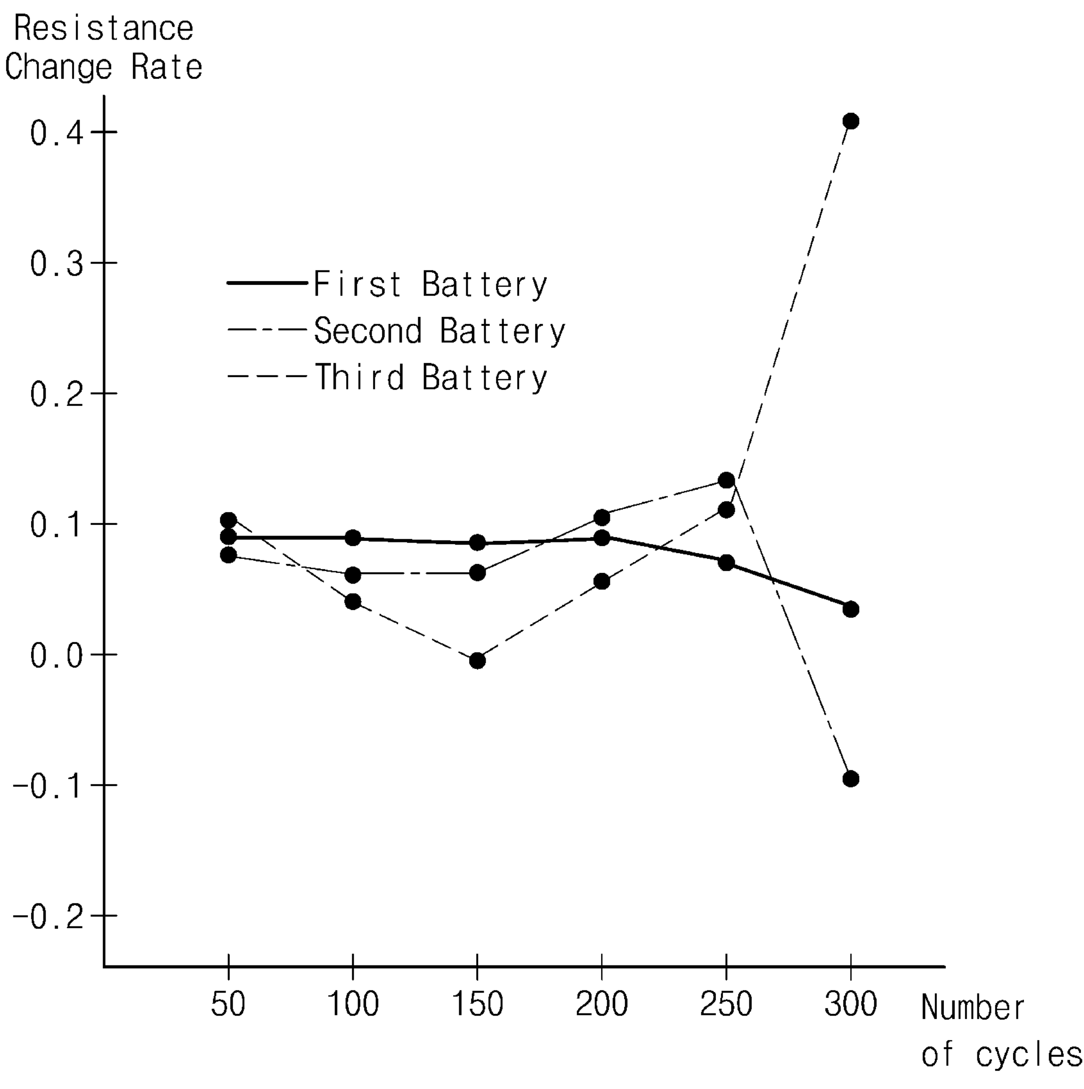
FIG. 5 is a graph illustrating a resistance change rate according to a change in the number of charging and discharging cycles of a battery of FIG. 1.

FIG. 5 is a graph illustrating a resistance change rate according to a change in the number of charging and discharging cycles of a battery of FIG. 1. In detail, the graph of FIG. 5 illustrates resistance change rate according to the number of charging and discharging cycles of the first to third batteries having different electrolyte components. In the graph of FIG. 5, a horizontal axis represents the number of charging and discharging cycles of the battery 110, and a vertical axis represents the resistance change rate of the battery 110 according to the number of charging and discharging cycles. The resistance change rate may be calculated by the resistance calculation unit 124 of FIG. 1. The configuration of each of the first to third batteries is as described above with respect to FIG. 2.

The resistance change rate may be calculated using Equation 2 below.

$$\text{Resistance change rate} = \frac{dR}{dn} \quad \text{[Equation 2]}$$

Here, 'R' means the resistance value of the battery. 'n' means the number of charging and discharging cycles of the battery 110.

Referring to FIG. 5, there is a clear difference between the resistance change rate of the first battery having a high residual value and the resistance change rates of the second and third batteries having low residual values. In the case of the first battery having a high residual value, the resistance change rate is uniformly maintained even when the number of charging and discharging cycles increases. In addition, the resistance change rate of the first battery converges to a value close to zero. In contrast, in the case of the second battery and the third battery having low residual values, the resistance change rate greatly changes as the number of charging and discharging cycles increases.

In detail, in the case of the second battery, the resistance change rate does not change significantly until 150 cycles, but the resistance change rate increases up to 250 cycles thereafter. The resistance change rate of the third battery has a negative value at 150 cycles, a positive value at 200 cycles, and a high positive value of 0.4 or more at 300 cycles.

In detail, the battery residual value evaluation system 100 according to an embodiment of the present disclosure may accurately determine the residual value of the battery based on whether the internal resistance change rate of the battery 110 is uniformly maintained even when the number of charging and discharging cycles of the battery 110 increases.

For example, the battery residual value evaluation system 100 may evaluate residual values of first to third batteries in which 200 cycles of charging and discharging operations are repeatedly performed. In this case, the battery residual value evaluation system 100 may determine that the first battery has the highest residual value based on the resistance change rate.

For example, unlike that illustrated in FIG. 5, a difference in resistance change rate trends of the first to third batteries subjected to charging and discharging operations for 50 cycles may be clear. In detail, the resistance change rate of the first battery has a value close to 0 and is maintained uniformly, and the resistance change rate of the second and third batteries may fluctuate greatly. In this case, the battery residual value evaluation system 100 may determine that the residual value of the first battery is the highest after performing only charging and discharging operations for 50 cycles.

In other words, the battery residual value evaluation system 100 may accurately determine the residual value of the battery based on whether the resistance change rate is maintained uniformly even if the number of cycles in which the charging and discharging operations of the battery 110 are performed is relatively small. In detail, the battery residual value evaluation system 100 may quickly and accurately determine the residual value of the battery 110.

The battery residual value evaluation system 100 according to an embodiment of the present disclosure may determine the residual value of the battery 110 by complexly considering a resistance value, a resistance change value, and a resistance change rate. The battery residual value evaluation system 100 may quickly and accurately determine the residual value of the battery 110 by considering resistance change rates as well as resistance values. In addition, the battery residual value evaluation system 100 according to an embodiment of the present disclosure may provide a criterion for clearly determining the residual value of the battery 110.

Figure 6:
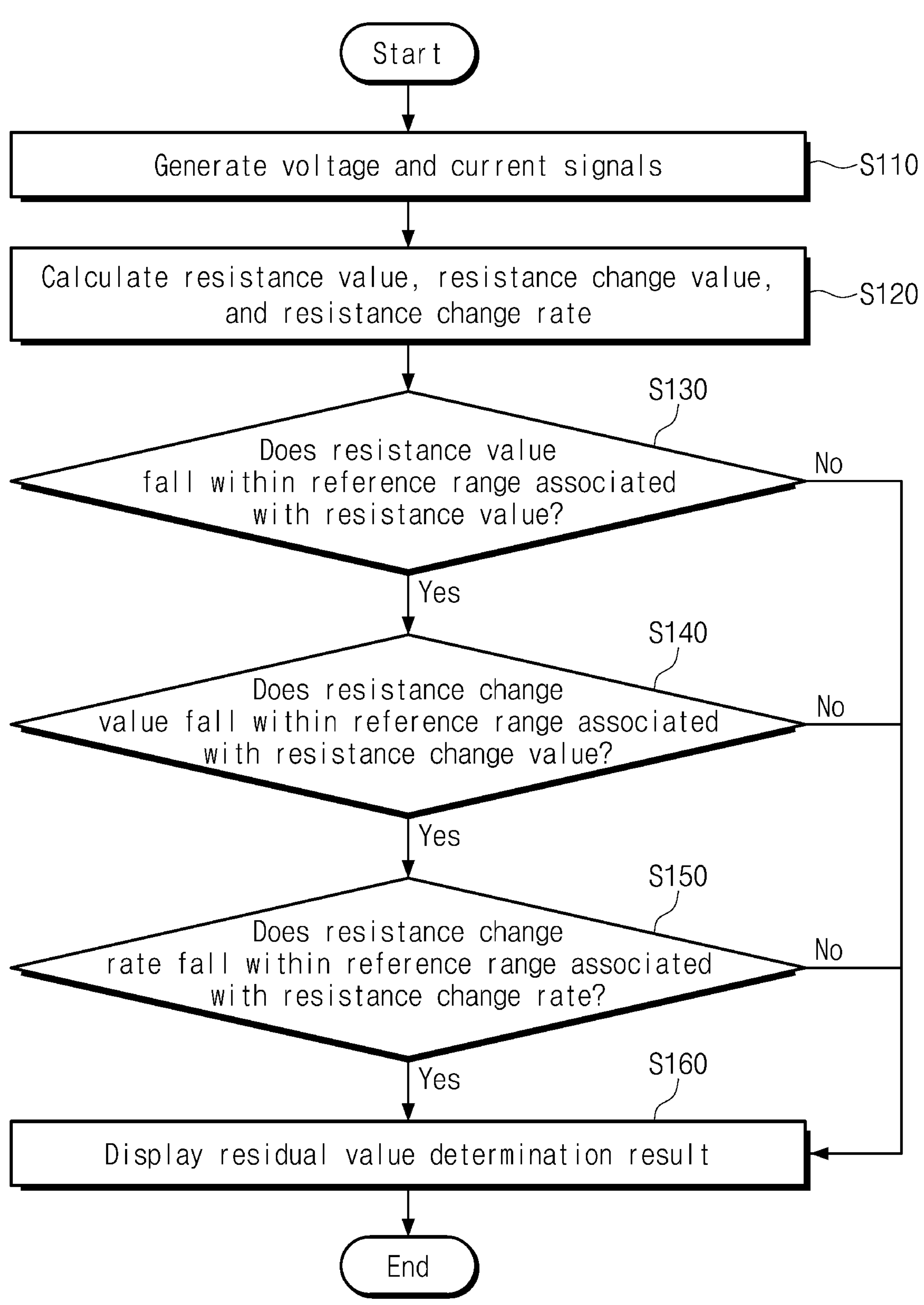
FIG. 6 is a flowchart for describing an operating method of a battery residual value evaluation system, according to an embodiment of the present disclosure.

FIG. 6 is a flowchart for describing an operating method of a battery residual value evaluation system, according to an embodiment of the present disclosure. FIG. 6 will be described with reference to FIG. 1.

In operation S110, the battery residual value evaluation system 100 may measure a voltage and current of the battery 110 to generate voltage and current signals. In addition, the voltage signal and the current signal, which are analog signals, may be converted into digital signals.

In operation S120, the battery residual value evaluation system 100 may calculate a resistance value, a resistance change value, and a resistance change rate of the battery 110 based on the voltage value and the current value included in the voltage signal and the current signal.

In operation S130, the battery residual value evaluation system 100 may determine whether the resistance value falls within a reference range associated with the resistance value. The reference range associated with the resistance value serves as a criterion for determining the residual value of the battery 110 and may be data input from the outside. The reference range associated with the resistance value may include a minimum resistance value and a maximum resistance value for evaluating the residual value of the battery 110. The battery residual value evaluation system 100 may perform operation S140 when the resistance value falls within the reference range associated with the resistance value. In detail, when the resistance value is greater than the minimum resistance value and less than the maximum resistance value within the reference range associated with the resistance value, operation S140 may be performed. The battery residual value evaluation system 100 may perform operation S160 when the resistance value does not fall within the reference range associated with the resistance value.

In operation S140, the battery residual value evaluation system 100 may determine whether the resistance change value falls within a reference range associated with the resistance change value. The reference range associated with the resistance change value serves as a criterion for determining the residual value of the battery 110 and may be data input from the outside. The reference range associated with the resistance change value may include a minimum resistance change value and a maximum resistance change value for evaluating the residual value of the battery 110. The battery residual value evaluation system 100 may perform operation S150 when the resistance change value falls within the reference range associated with the resistance change value.

In detail, when the resistance change value is greater than a minimum resistance change value and less than a maximum resistance change value within the reference range associated with the resistance change value, operation S150 may be performed. The battery residual value evaluation system 100 may perform operation S160 when the resistance change value does not fall within the reference range associated with the resistance change value.

In operation S150, the battery residual value evaluation system 100 may determine whether the resistance change rate falls within a reference range associated with the resistance change rate. The reference range associated with the resistance change rate serves as a criterion for determining the residual value of the battery 110 and may be data input from the outside. The reference range associated with the resistance change rate may include a minimum resistance change rate and a maximum resistance change rate for evaluating the residual value of the battery 110.

In operation S160, the battery residual value evaluation system 100 may display the residual value determination result of the battery 110. The battery residual value evaluation system 100 may externally display the residual value determination result of the battery 110 through a monitor (e.g., through a monitor included in the output unit 128 of the residual value evaluation device 120).

For example, when the resistance value does not fall within the reference range associated with the resistance value, the battery residual value evaluation system 100 may display a determination result including information indicating that the residual value of the battery 110 is low.

For example, when the resistance value falls within the reference range associated with the resistance value and the resistance change value does not fall within the reference range associated with the resistance change value, the battery residual value evaluation system 100 may display a determination result including information indicating that the residual value of the battery 110 is low.

For example, when the resistance value falls within the reference range associated with the resistance value, the resistance change value falls within the reference range associated with the resistance change value, and the resistance change rate does not fall within the reference range associated with the resistance change rate, the battery residual value evaluation system 100 may display a determination result including information indicating that the residual value of the battery 110 is medium.

For example, when the resistance value falls within the reference range associated with the resistance value, the resistance change value falls within the reference range associated with the resistance change value, and the resistance change rate falls within the reference range associated with the resistance change rate, the battery residual value evaluation system 100 may display a determination result including information indicating that the residual value of the battery 110 is high.

According to an embodiment of the present disclosure, the residual value of the lithium secondary battery may be quickly and accurately predicted by calculating the resistance change rate of the lithium secondary battery. Accordingly, a battery residual value evaluation system with improved performance and an operation method thereof are provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A battery residual value evaluation system comprising:

a measurement unit configured to measure a voltage and a current of a battery during a plurality of charging and discharging cycles to generate an analog voltage signal and an analog current signal;

a conversion unit comprising an analog-to-digital converter configured to convert the analog voltage signal and the analog current signal into digital signals;

a resistance calculation unit configured to:

calculate an internal resistance value of the battery based on the digital signals;

calculate a resistance change value, representing a difference between the internal resistance value and an initial resistance value; and calculate a resistance change rate representing a change in the internal resistance value per unit cycle, wherein the resistance calculation unit is configured to calculate the resistance value, the resistance change value, and the resistance change rate only when a change in current values of the digital signals is detected;

an external input unit configured to receive a plurality of reference ranges from an outside via Inter-Integrated Circuit (I2C) communication;

a determination unit configured to generate a determination result of a battery residual value by sequentially determining whether each of the resistance value, the resistance change value, and the resistance change rate falls within a corresponding one of the plurality of reference ranges; and an output unit comprising a display device configured to output the determination result to the outside.

2. The battery residual value evaluation system of claim 1, further comprising:

a measurement register unit configured to store the digital signals, and wherein the measurement register unit includes a voltage register configured to store the digital signal generated by converting the analog voltage signal and a current register configured to store the digital signal generated by converting the analog current signal.

3. The battery residual value evaluation system of claim 1, further comprising:

a resistance register unit configured to store the resistance value, the resistance change value, and the resistance change rate.

4. The battery residual value evaluation system of claim 1, wherein the plurality of reference ranges include a first reference range, a second reference range, and a third reference range, wherein the first reference range includes information on a minimum resistance value and a maximum resistance value which are criteria for determining the battery residual value, wherein the second reference range includes information on a minimum resistance change value and a maximum resistance change value which are criteria for determining the battery residual value, and wherein the third reference range includes information on a minimum resistance change rate and a maximum change rate which are criteria for determining the battery residual value.

5. The battery residual value evaluation system of claim 4, wherein each of the first to third reference ranges is pre-learned and generated through machine learning.

6. The battery residual value evaluation system of claim 4, wherein, when the resistance value is greater than the minimum resistance value included in the first reference range and is not less than the maximum resistance value included in the first reference range, the determination result is configured to include information indicating that the battery residual value is low.

7. The battery residual value evaluation system of claim 6, wherein, when the resistance value is greater than the minimum resistance value included in the first reference range and is less than the maximum resistance value included in the first reference range, and when the resistance change value is greater than the minimum resistance change value included in the second reference range and is not less than the maximum resistance change value included in the second reference range, the determination result is configured to include information indicating that the battery residual value is low.

8. The battery residual value evaluation system of claim 7, wherein, when the resistance value is greater than the minimum resistance value included in the first reference range and is less than the maximum resistance value included in the first reference range, when the resistance change value is greater than the minimum resistance change value included in the second reference range and is less than the maximum resistance change value included in the second reference range, and when the resistance change rate is greater than the minimum resistance change rate included in the third reference range and is not less than the maximum resistance change rate included in the third reference range, the determination result is configured to include information indicating that the battery residual value is medium.

9. The battery residual value evaluation system of claim 8, wherein, when the resistance value is greater than the minimum resistance value included in the first reference range and is less than the maximum resistance value included in the first reference range, when the resistance change value is greater than the minimum resistance change value included in the second reference range and is less than the maximum resistance change value included in the second reference range, and when the resistance change rate is greater than the minimum resistance change rate included in the third reference range and is less than the maximum resistance change rate included in the third reference range, the determination result is configured to include information indicating that the battery residual value is high.

10. A method of operating a battery residual value evaluation system, the method comprising:

measuring, by a measurement unit, a voltage and a current of a battery during a plurality of charging and discharging cycles to generate an analog voltage signal and an analog current signal;

converting, by a conversion unit comprising an analog-to-digital converter, the analog voltage signal and the analog current signal into digital signals;

calculating, by a resistance calculation unit, an internal resistance value of the battery based on the digital signals, a resistance change value representing a difference between the internal resistance value and an initial resistance value, and a resistance change rate representing a change in the internal resistance value per unit cycle, wherein the resistance value, the resistance change value, and the resistance change rate are calculated only when a change in current values of the digital signals is detected;

receiving, by an external input unit, a plurality of reference ranges from an outside via Inter-Integrated Circuit (I2C) communication;

generating, by a determination unit, a determination result of a battery residual value by sequentially determining whether each of the resistance value, the resistance change value, and the resistance change rate falls within a corresponding one of the plurality of reference ranges; and outputting, by an output unit comprising a display device, the determination result to the outside.

11. The method of claim 10, wherein the plurality of reference ranges include a first reference range, a second reference range, and a third reference range, wherein the first reference range includes information on a minimum resistance value and a maximum resistance value which are criteria for determining the battery residual value, wherein the second reference range includes information on a minimum resistance change value and a maximum resistance change value which are criteria for determining the battery residual value, and wherein the third reference range includes information on a minimum resistance change rate and a maximum change rate which are criteria for determining the battery residual value.

12. The method of claim 11, wherein when the resistance value is greater than the minimum resistance value included in the first reference range and is not less than the maximum resistance value included in the first reference range, the determination result includes information indicating that the battery residual value is low.

13. The method of claim 12, wherein when the resistance change value is greater than the minimum resistance change value included in the second reference range and is not less than the maximum resistance value included in the second reference range, the determination result includes information indicating that the battery residual value is low.

14. The method of claim 13, wherein the sequentially determining further includes:

when the resistance change rate is greater than the minimum resistance change rate included in the third reference range and is not less than the maximum resistance change rate included the third reference range, the determination result includes information indicating that the battery residual value is medium; and when the resistance change rate is greater than the minimum resistance change rate included in the third reference range and is less than the maximum resistance change rate included the third reference range, the determination result includes information indicating that the battery residual value is high.

* * * * *